(12) United States Patent
Funahashi et al.

(10) Patent No.: US 7,915,609 B2
(45) Date of Patent: Mar. 29, 2011

(54) SMECTIC LIQUID CRYSTAL COMPOUND

(75) Inventors: Masahiro Funahashi, Tsukuba (JP); Fuxapei Chan, Tsukuba (JP); Nobuyuki Tamaoki, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 160 days.

(21) Appl. No.: 12/303,751

(22) PCT Filed: Jun. 5, 2007

(86) PCT No.: PCT/JP2007/061353
§ 371 (c)(1), (2), (4) Date: May 8, 2009

(87) PCT Pub. No.: WO2007/142228
PCT Pub. Date: Dec. 13, 2007

(65) Prior Publication Data
US 2010/0237327 A1    Sep. 23, 2010

(30) Foreign Application Priority Data

Jun. 8, 2006 (JP) ................................. 2006-160285
Nov. 13, 2006 (JP) ................................. 2006-306942

(51) Int. Cl.
H01L 35/24 (2006.01)

(52) U.S. Cl. ........... 257/40; 257/E51.028; 257/E51.038; 438/99; 549/59

(58) Field of Classification Search ............ 257/40, 257/E51.028, E51.038; 438/99; 549/59
See application file for complete search history.

(56) References Cited

U.S. PATENT DOCUMENTS 4,645,777 A    2/1987 Burkart et al.
(Continued)

FOREIGN PATENT DOCUMENTS

| JP | 2 142783 | 5/1990 |
|----|----------|--------|
| JP | 2001 233872 | 8/2001 |
| JP | 2005 240021 | 9/2005 |
| WO | 86 05949 | 10/1986 |

OTHER PUBLICATIONS

Masahiro Funahashi, et al., "Electronic Conduction in the Chiral Nematic Phase of an Oligothiophene Derivative", Chemphyschem, vol. 7, No. 6, XP002529696, 2006, pp. 1193-1197.

(Continued)

*Primary Examiner* — Tu-Tu V Ho
(74) *Attorney, Agent, or Firm* — Oblon, Spivak, McClelland, Maier & Neustadt, L.L.P.

(57) ABSTRACT

According to the present invention, a liquid crystal semiconductor capable of exhibiting a highly ordered smectic phase at approximately room temperature, being used for formation of a smectic liquid crystal thin film that is stable at room temperature by a solution process, and showing excellent ambipolar charge-transporting properties, a thin film transistor comprising the same, and the like are provided.

Also, the following are provided: a smectic liquid crystal compound represented by the following general formula (1)

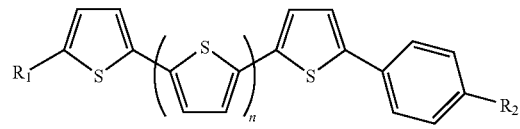

wherein $R_1$ represents a straight-chain alkyl group having 1 to 8 carbon atoms, $R_2$ represents an alkyl or alkoxy group having 1 to 8 carbon atoms, and "n" is an integer of 0 to 3; an ambipolar charge-transporting material comprising the smectic liquid crystal compound; an organic semiconductor thin film having a thin film layer comprising the smectic liquid crystal compound; and a thin film transistor comprising the organic semiconductor thin film.

7 Claims, 7 Drawing Sheets

U.S. PATENT DOCUMENTS

| | | | |
|---|---|---|---|
| 4,939,165 A | 7/1990 | Burkart et al. | |
| 5,158,598 A | 10/1992 | Kober et al. | |
| 7,126,013 B2 * | 10/2006 | Heeney et al. | 549/59 |
| 7,405,003 B2 * | 7/2008 | Maeda et al. | 428/411.1 |
| 2006/0234335 A1 | 10/2006 | Nakamura | |

OTHER PUBLICATIONS

Benjamin W. Messmore, et al., "Synthesis, Self-Assembly, and Charaterization of Supramolecular Polymers from Electroactive Dendron Rodcoil Molecules", J. Am. Chem. Soc., vol. 126, No. 44, XP002529697, 2004, pp. 14452-14458.

* cited by examiner (a)

(b)

(a)

(b)

SMECTIC LIQUID CRYSTAL COMPOUND

TECHNICAL FIELD

The present invention relates to a liquid crystal compound capable of exhibiting a stable highly ordered smectic phase at room temperature, being used for film formation by a solution process such as a spin coating method or the like, and showing high carrier mobility. The present invention also relates to an ambipolar charge-transporting material and an organic semiconductor thin film using the same. It further relates to a thin film transistor and the like using such an organic semiconductor thin film.

BACKGROUND ART

In recent years, the expanded use of organic semiconductors for optoelectronics devices (such as practicable organic LEDs, thin film transistors, and solar cells) has been actively examined. Organic semiconductors are advantageous in that, in general, they can be obtained at low cost and can be easily used for thin film formation. It has been attempted to utilize the flexibility thereof for plastic electronics including construction of devices on polymer substrates.

In particular, organic thin film transistors are devices that are important for realizing flexible devices such as electronic paper. In order to produce a practical device with high-speed switching characteristics at low cost, production of a large-area uniform thin film having high carrier mobility and low defect density must be simplified. Recently, thin film transistors comprising fused polycyclic aromatic compounds such as pentacene have been examined.

However, in general, fused polycyclic aromatic compounds have low solubility in solvents, and it is difficult to subject them to film formation by a solution process such as spin coating. Thus, for high-quality thin film formation, a vacuum deposition method must be used, which results in high costs.

In addition, in a case in which a thin film is produced by a vacuum deposition method, the obtained thin film is a polycrystalline thin film comprising submicron-scale crystal grains. However, electronic properties such as carrier mobility are significantly influenced by grain boundaries between crystal grains. Thus, in order to obtain a high-quality thin film, strict control of crystal growth conditions is necessary.

Further, it is not easy to produce a large-area uniform thin film by a vacuum process. Therefore, it cannot be said that such process is always appropriate for industrial applications. An organic semiconductor material with which a large-area uniform thin film having low defect density can be readily produced by a low-cost solution process has been desired.

In a known example of an organic thin film transistor produced by a solution process, solubility in organic solvents is imparted by introducing a trialkylsilylethynyl group into pentacene (Non-Patent Document 1).

However, thin film transistors produced by a solution process are generally highly inferior to thin film transistors produced by vacuum deposition in terms of mobility and on-off ratio. Thus, it cannot be said that the former have sufficient characteristics.

In general, liquid crystal materials have long-chain alkyl groups, and thus they are highly soluble in organic solvents. Thus, they can be subjected to film formation involving a solution process. In addition, in a liquid crystal phase, flexibility and fluidity based on degree of freedom of molecular motion are exhibited, resulting in inhibition of formation of crystal grain boundaries, which is problematic for polycrystalline thin films. Therefore, liquid crystal materials have a potential to be used for production of high-quality semiconductor thin films exhibiting high carrier mobility with ease. Hence, studies of organic semiconductors having liquid crystal properties, which mainly focus on evaluation of physical properties in a bulk state, have been conducted in order to examine the charge transport mechanism and the correlation between the liquid crystal phase structure and carrier mobility (Non-Patent Document 2).

In several recent years, such potential of liquid crystal semiconductors has been gaining attention, and thin film transistors comprising liquid crystal semiconductors have been examined.

Examples of such thin film transistors are as follows: (1): a thin film transistor comprising a vacuum-deposited film for a liquid crystal semiconductor (Non-Patent Document 3); and (2): a thin film transistor produced using a crystalline thin film that is obtained by causing molecular orientation in a liquid crystal phase followed by cooling (Non-Patent Document 4). In the former case, the high cost of the vacuum process and the difficulty involved with large-area thin film formation have not been solved. Also, in the latter case, structural defect generation upon crystallization causes reduction in device characteristics and thus sufficient and beneficial device characteristics cannot be obtained.

As an aside, semiconductors having liquid crystal properties exhibit fluidity in the liquid crystal phase and thus they are generally introduced into a liquid crystal cell comprising two glass plates, following which they are used. In addition, in many cases, the temperature range within which a liquid crystal phase can be exhibited in a material exceeds room temperature. Thus, in order to take advantage of charge-transporting properties exhibited in a liquid crystal phase, it is necessary to heat a sample. When such a liquid crystal material is used to produce a thin film at room temperature by spin coating or a casting method, the thin film becomes crystallized, making it difficult to obtain a high-quality uniform thin film.

In consideration of production of a thin film electronic device with the use of a liquid crystal semiconductor by a solution process, a liquid crystal semiconductor that can maintain a liquid crystal phase at room temperature is necessary.

In general, in order to extend the temperature range of a liquid crystal phase to room temperature or less, it is necessary to prevent crystallization by inhibiting intermolecular packing. However, in terms of organic semiconductors, inhibition of intermolecular packing causes reduction in the intermolecular charge transfer rate and in carrier mobility, which is not desirable (Non-Patent Document 5).

Meanwhile, in recent years, materials exhibiting high carrier mobility in a highly ordered smectic phase have been reported (Non-Patent Documents 4 and 6).

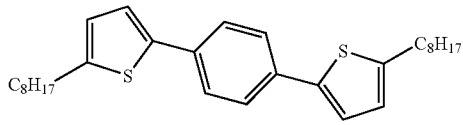

$\mu_+ \sim 0.1 \text{ cm}^2/\text{Vs at } 45°\text{ C.}$ reported by K. Oikawa (ref. 6)

-continued

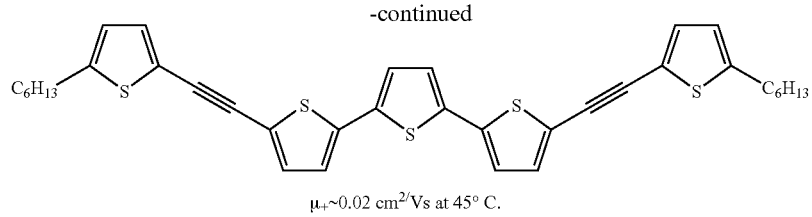

$\mu_+ \sim 0.02$ cm$^2$/Vs at 45° C.

reported by A. J. J. M. van Breemen (ref. 4)

However, each molecule of such material has a symmetric structure and thus tends to be crystallized. Accordingly, a liquid crystal phase cannot be maintained at approximately room temperature, resulting in crystallization. Thus, effective carrier transportation cannot be achieved, which is disadvantageous.

In addition, Funahashi et al. revealed that an alkylalkynyloligothiophene derivative having an asymmetric structure exhibits a highly ordered smectic phase in a wide temperature range that includes room temperature and that high carrier mobility comparable to that of a molecular crystal is achieved in such phase (Non-Patent Document 7).

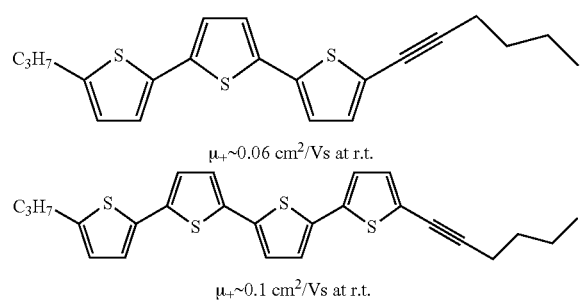

$\mu_+ \sim 0.06$ cm$^2$/Vs at r.t.

$\mu_+ \sim 0.1$ cm$^2$/Vs at r.t.

reported by M. Funahashi (ref. 7)

However, in the cases of the above conventionally known liquid crystal materials and the like, it is difficult to produce a uniform thin film with the use of such a material, although high carrier mobility is exhibited in a bulk state. When such a material is formed into a thin film, high carrier mobility cannot be maintained. In addition to this, in any of the above materials, hole transport alone takes place. Also, in the cases of non-liquid crystal semiconductors such as polycrystalline semiconductor thin films and organic amorphous semiconductors, materials exhibiting a high electron mobility of more than 0.1 cm$^2$/Vs are extremely limited. When a logic circuit having advanced electronic functions such as an inverter circuit is constructed by combining thin film transistors each comprising an organic semiconductor, a material having not only high hole mobility but also high electron mobility is desirable. In addition, also in the cases of electroluminescence elements, luminescence is caused by recombination of holes and electrons. Thus, it is desired that holes and electrons should be transported in an efficient manner.

Further, an organic semiconductor necessary in practice is an organic semiconductor having a hole mobility and an electron mobility of more than 0.1 cm$^2$/Vs, with which a high-quality thin film can be obtained by a solution process.

Non-Patent Document 1: J. E. Anthony et al., J. Am. Chem. Soc., 127, 4986 (2005)

Non-Patent Document 2: Masahiro Funahashi, "Kinou-Zairyou" (Functional Material), 2005, December issue, p. 7

Non-Patent Document 3: K. Oikawa, H. Monobe, and Y. Shimizu et al., Adr., Mater., in press Non-Patent Document 4: A. J. J. M. van Breemen, "Large Area Liquid Crystal Monodomain Field-Effect Transistors," J. Am. Chem. Soc., 128, 2336 (2006)

Non-Patent Document 5: M. Funahashi and J. Hanna, Mol. Cryst. Liq. Cryst., 410, 529 (2004)

Non-Patent Document 6: K. Oikawa, H. Monobe, J. Takahashi, K. Tsuchiya, B. Heinrich, D. Guillon, and Y. Shimizu, Chem. Commun., 2005, 5337

Non-Patent Document 7: M. Funahashi and J. Hanna, Adv. Mater., 17, 594 (2005)

DISCLOSURE OF THE INVENTION

Problem to be Solved by the Invention

It is an objective of the present invention to provide a novel smectic liquid crystal compound exhibiting excellent ambipolar charge transport characteristics, with which film formation is achieved by a low-cost solution process such that an organic semiconductor thin film produced by the solution process can be applied to logic elements such as electroluminescence elements, thin film transistors, and inverter circuits.

Means for Solving Problem

As a result of intensive studies of a smectic liquid crystal compound that is useful for electroluminescence elements and thin film transistors, the present inventors have found that a phenyloligothiophene derivative having an asymmetric structure exhibits a highly ordered liquid crystal phase at approximately room temperature, that a high-quality thin film can be produced with the compound by a solution process, and that the compound has high hole-transporting properties and high electron-transporting properties. This has led to the completion of the present invention.

Specifically, according to this application, the following inventions are provided.

<1> A smectic liquid crystal compound represented by the following general formula (I)

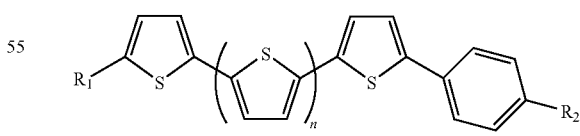

wherein $R_1$ represents a straight-chain alkyl group having 1 to 8 carbon atoms, $R_2$ represents an alkyl or alkoxy group having 1 to 8 carbon atoms, and "n" is an integer of 0 to 3.

<2> An ambipolar charge-transporting material comprising the smectic liquid crystal compound according to <1>.

<3> An organic semiconductor thin film having a substrate and a thin film layer comprising the smectic liquid crystal compound according to <1>.

<4> The organic semiconductor thin film according to <3>, wherein the substrate is a silicon substrate having a thermally oxidized film.

<5> A method for producing the organic semiconductor thin film according to <3> or <4>, comprising the steps of: applying a solution comprising the smectic liquid crystal compound according to <1> to a substrate; and annealing the applied liquid crystal compound.

<6> A thin film transistor comprising the organic semiconductor thin film according to <3> or <4>.

<7> The thin film transistor according to <6>, wherein the semiconductor thin film is a p-type semiconductor.

EFFECTS OF THE INVENTION

The smectic liquid crystal compound represented by the general formula (I) of the present invention exhibits a highly ordered liquid crystal phase in a wide temperature range that includes room temperature. With the use of such compound, it is possible to produce a high-quality liquid crystal thin film by a solution process, such as spin coating, at room temperature. Unlike the case of a crystalline phase, a liquid crystal phase has flexibility and a certain degree of freedom of molecular motion. Thus, generation of structural defects is unlikely to occur compared with the case of a polycrystalline thin film, and a semiconductor thin film with higher quality can be produced at low cost.

In addition, in the case of the liquid crystal material represented by the above general formula (I) of the present invention, liquid crystal molecules are arranged in accordance with a positional long-range order in a highly ordered smectic phase and they are tightly packed, resulting in fast intermolecular charge transfer. Consequently, it exhibits high hole mobility and high electron mobility. Due to the above characteristics, the liquid crystal substance of the present invention can be applied to thin film transistors and electroluminescence elements.

That is, for organic thin film transistors, it is essential to reduce structural defects generated as a result of reconstruction of the molecular orientation structure by heat-annealing treatment in a case in which either a vacuum-deposited film or a film produced by a solution process is used. In the case of the smectic liquid crystal compound according to the present invention, liquid crystal molecules are in a frozen state at room temperature in terms of molecular motion; however, thermal motion of alkyl group and rotational motion around a molecular axis can be induced to some extent at 150° C. or more. Thus, compared with a conventional molecular crystal, reconstruction of molecular orientation by heat-annealing is a distinctive feature. Therefore, a high-quality thin film having molecular-level smoothness can be produced by subjecting a produced thin film to heat annealing. A thin film transistor can be produced by a simple process with the use of the thus obtained thin film. Reflecting the low defect density of the thin film, the resulting thin film transistor exhibits high carrier mobility and a high on/off ratio.

BEST MODE FOR CARRYING OUT THE INVENTION

Figure 1:
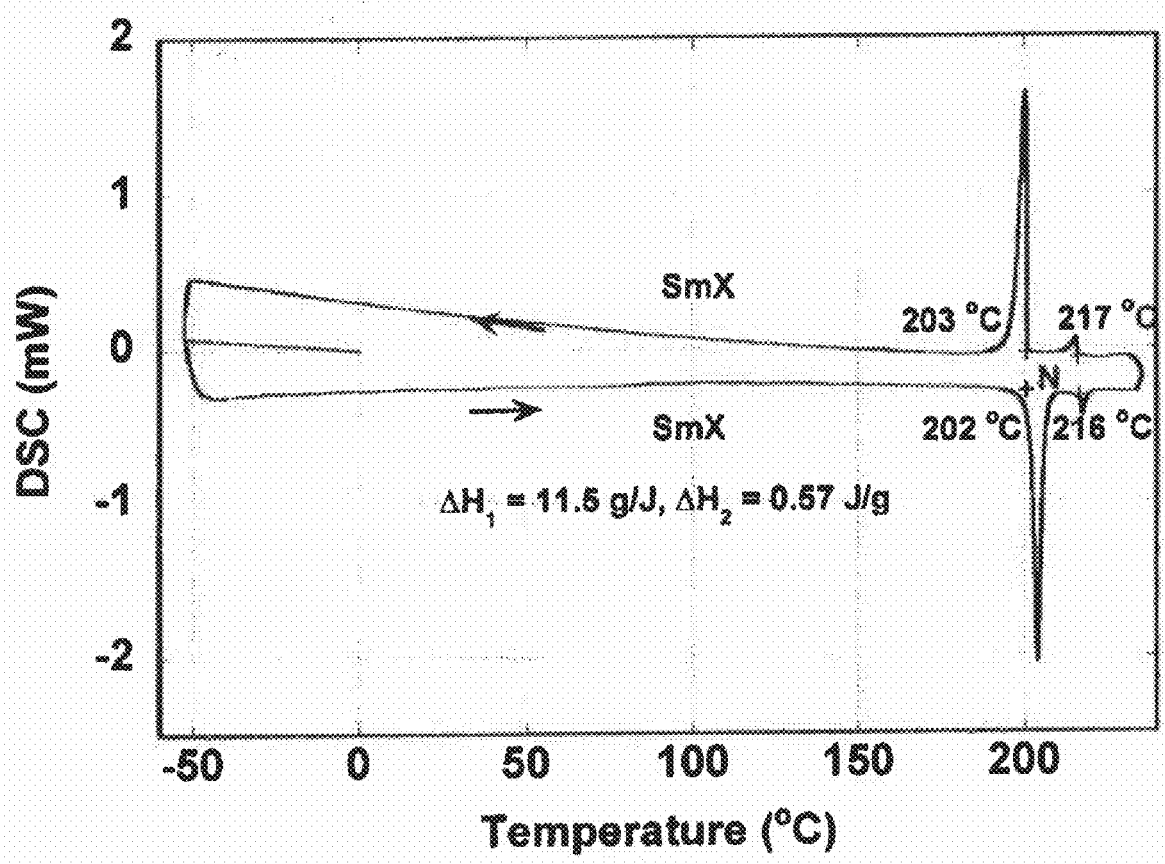
FIG. 1 shows a DSC curve of the smectic liquid crystal obtained in Example 1.

The smectic liquid crystal compound of the present invention is represented by the following general formula (I):

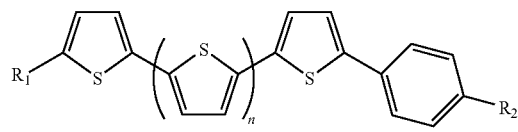

wherein $R_1$ represents a straight-chain alkyl group having 1 to 8 carbon atoms, $R_2$ represents an alkyl group or an alkoxy group having 1 to 8 carbon atoms, and "n" is an integer of 0 to 3.

In the above general formula (I), $R_1$ represents a straight-chain alkyl group having 1 to 8 carbon atoms. Specific examples thereof include an ethyl group, a propyl group, a butyl group, a pentyl group, and a hexyl group. Of these, a propyl group is preferable.

In the general formula (I), $R_2$ represents a straight-chain alkyl group or alkoxy group having 1 to 8 carbon atoms. Specific examples thereof include an ethyl group, a propyl group, a butyl group, a pentyl group, and a hexyl group. Of these, a propyl group is preferable. Also, "n" is an integer of 0 to 3 and is preferably 1.

The smectic liquid crystal compound represented by the general formula (I) of the present invention can be synthesized by a variety of methods. For instance, as shown in the following synthetic reaction formula, a phenylterthiophene derivative 4 (I) of interest can be obtained in the following manner. A reaction mixture is obtained by treating a terthiophene derivative 1 with N-bromosuccinimide in THF and subjecting the resulting bromoterthiophene derivative 2 and alkylphenyl borate 5 to reflux in dimethoxyethane in the presence of, preferably, a $Pd(PPh_3)_4$ catalyst and $Na_2CO_3$. After cooling, water is added to the mixture to separate a precipitate by filtration. The obtained precipitate is purified by column chromatography using silica gel (developing solvent: heated cyclohexane), followed by recrystallization with n-hexane.

In addition, the terthiophene derivative used as a starting material is a known substance. It can be synthesized by, for example, a method described in M. Funahashi et al., Adv. Mater., 17, 594 (2005). Further, the alkylphenyl borate 5 can be synthesized by a known method with the use of a commercially available alkylbromobenzene 4 (e.g., "Jikken Kagaku Koza/Yuki Gosei IV" (Experimental Chemistry Course/Organic Synthesis VI), edited by the Chemical Society of Japan, 4th edition, p. 80).

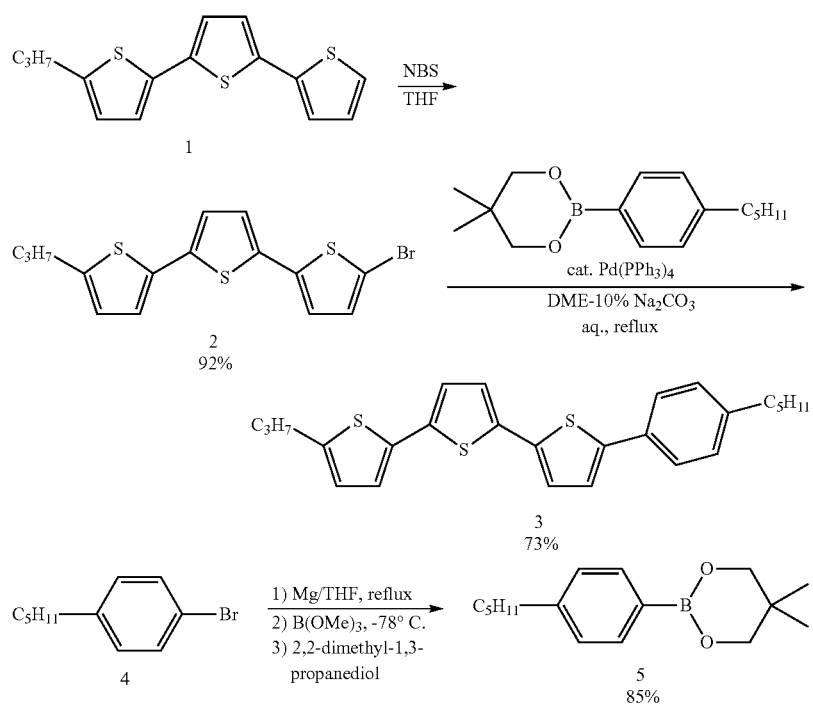

The liquid crystal compound of the present invention exhibits a highly ordered smectic phase at 210° C. or less, and it is not crystallized even when being cooled to −50° C. Thus, a liquid crystal thin film that is stable at approximately room temperature can be produced. Further, it exhibits high hole mobility and high electron mobility in a liquid crystal phase, which are comparable to those of a molecular crystal.

Specifically, in the case of the liquid crystal compound provided according to the present invention, mosaic texture peculiar to a highly ordered smectic phase is observed in a liquid crystal phase under observation with a polarizing microscope. Also, an X-ray diffraction pattern peculiar to a highly ordered smectic phase is observed in a liquid crystal phase. While crystallization is inhibited due to the asymmetrical molecular structure, tight packing of phenyloligothiophene portions having excellent flatness takes place. Thus, a highly ordered smectic phase can be stably retained in a wide temperature range that includes room temperature. In view of such characteristics, also in a case in which a sample is produced by injecting the liquid crystal material into a liquid crystal cell, or in which a thin film is produced by a casting method in a solution, a liquid crystal semiconductor thin film that is stable at approximately room temperature can be produced. Such characteristics are essential in order to drive a practical optoelectronics device at approximately room temperature.

Further, the liquid crystal compound of the present invention has oligothiophene skeletons having a large π electron conjugated system, in which intermolecular π-orbitals sufficiently overlap, and they are tightly packed. Thus, intermolecular charge transfer smoothly proceeds and electron conductivity is promoted, such that organic semiconductor charge-transporting properties are exhibited. Specifically, when the carrier mobility in a liquid crystal phase is measured by the time-of-flight method, both a positive carrier and a negative carrier exhibit high carrier mobility of more than 0.1 cm$^2$/Vs, which is comparable to that of a molecular crystal.

The liquid crystal compound with such characteristics of the present invention can be applied to thin film transistors and electroluminescence elements produced by a solution process.

Hereafter, a typical embodiment of production of the thin film transistor of the present invention is described. First, the smectic liquid crystal compound represented by the general formula (I) described above is dissolved in an organic solvent such as chlorobenzene. The solution is used for spin coating on a silicon substrate having a thermally oxidized film (SiO$_2$) thereon for film formation such that an organic semiconductor thin film 20 to 100 nm in thickness can be obtained.

As a result of observation with a polarizing microscope, the obtained organic semiconductor thin film was confirmed to be a thin film having domains having sizes of several hundred micrometers. Such domain size is larger than that of conventional molecular crystalline deposited films comprising pentacene or the like (several micrometers in general). Also, such domain size is larger than the channel length of the transistor of the present invention.

Moreover, as a result of observation with an atomic force microscope (AFM), the surface of each domain has several-tens-of-nanometer concave-convex portions. When such thin film is annealed at 120° C. for 10 minutes, the domain size itself does not significantly vary, but the surface morphology significantly varies. AFM observation showed that each domain had molecular-level flatness. These results indicate that, when the obtained thin film was subjected to heat annealing, rearrangement of liquid crystal molecules took place due to thermal motion thereof and thus structural defects were significantly reduced, resulting in a high-quality thin film. In the case of a molecular crystalline vacuum-deposited film comprising pentacene or the like, in view of the rigid crystal structure, heating at 200° C. or more for several hours is necessary, in general, for rearrangement of molecular sequence caused by heat annealing. Further, such thin films generally have several-nanometer to several-tens-of-nanometer concave-convex portions on the surfaces thereof, resulting in inhibition of charge transport and charge injection.

Gold electrodes 5 mm in length and 0.2 mm in width are vacuum-deposited on the thus obtained thin film at intervals of 20 to 50 μm such that a source electrode and a drain electrode are formed. Accordingly, the thin film transistor of the present invention can be obtained.

The transistor showed p-type behavior under normal atmosphere. The electric field mobility thereof was 0.05 cm$^2$/Vs and the on-off ratio thereof was 10$^6$. The values are inferior to those of a transistor comprising polycrystalline (molecular crystalline) thin film produced by a vacuum deposition method. However, in consideration of the fact that the transistor was produced by a solution process, excellent characteristics were achieved. In the case of the material of the present invention, not only hole transport but also electron transport in a bulk state were confirmed at room temperature. Thus, a transistor produced using the material shows ambipolar behavior in a case in which effects of oxygen and moisture can be excluded. With the use of such characteristics, a CMOS element such as an inverter circuit can be produced.

EXAMPLES

The present invention is hereafter described in greater detail with reference to the following examples.

Reference Example 1

Synthesis of alkylphenyl borate 5(R=C$_5$H$_{11}$)

THF (50 ml) is added to metal magnesium (1.22 g; 0.051 mol), followed by agitation. After iodine (50 mg) is added thereto, a THF solution (10 ml) containing 4-bromopentylbenzene (4) (10.8 g; 0.048 mol) is slowly added dropwise thereto. Soon thereafter, a reaction is initiated. The THF solution (4) is added dropwise thereto at an appropriate speed to cause moderate reflux of the reaction solution. After the completion of dropwise addition, reflux of the solution is carried out for 1 hour. Then, it is cooled to −78° C. and a THF solution (10 ml) containing trimethyl borate (5.9 g; 0.057 mol) is added dropwise thereto. Then, the temperature is increased to room temperature, followed by agitation for 3 hours. Subsequently, 2,2-dimethylpropane-1,3-diol (5.4 g; 0.052 mol) is added thereto, followed by agitation for 1 hour. Water is added to terminate the reaction and the water phase is removed using a separatory funnel. After drying with sodium sulfate, the solvent is removed by distillation and the residue is recrystallized with hexane (yield: 8.1 g (0.031 mol; yield percentage: 65%)).

Example 1

Synthesis of 5-propyl-5"-(4-pentylphenyl)-2,2':5',2"-terthiophene derivative (3) (R$_1$=C$_3$H$_7$, R$_2$=C$_5$H$_{11}$, n=1 in general formula (1))

5-propyl-5"-bromo-2,2':5',2"-terthiophene (2) (0.51 g; 1.38 mmol), 4-pentylphenyl borate (50.48 g; 1.85 mmol), and tetrakis(triphenylphosphine)palladium (0) (0.037 g; 0.03 mmol) were dissolved in dimethoxyethane (50 ml) and a 10 wt % sodium carbonate aqueous solution (50 ml) was added thereto, followed by reflux for 1 hour. After cooling to room temperature, a precipitate generated as a result of addition of water was separated by filtration, followed by purification with silica gel column chromatography (developing solvent: cyclohexane). Then, the resultant was recrystallized with n-hexane (yield: 0.47 g (1.08 mmol; yield percentage: 78%)).

Example 2

Identification of Liquid Crystal Phase and Measurement of Vitrification Temperature Identification of the liquid crystal phase of the liquid crystal compound 3 obtained in Example 1 was carried out as follows.

The liquid crystal compound obtained in Example 1 was melted at 200° C. and allowed to infiltrate into a liquid crystal cell comprising two ITO electrode glass substrates 10 μm in thickness by capillary action. The liquid crystal cell was placed on a hot stage and the optical texture was observed with a polarizing microscope under temperature control. At 205° C., schlieren texture peculiar to a nematic phase was observed; however, at 200° C. or less, mosaic texture peculiar to a highly ordered smectic phase was observed. Even after cooling to room temperature or lower, no changes were observed in this optical texture, indicating that a highly ordered smectic phase is maintained in a wide temperature range that includes room temperature. In addition, in the smectic phase, even upon electric field application, no changes were observed in the optical texture. Thus, it was found that molecular orientation conditions are not disturbed by an electric field.

Further, the phase transition temperature of the liquid crystal compound 3 obtained in Example 1 was measured by differential scanning calorimetry (DSC) (FIG. 1). In addition to a peak at 210° C. indicating transition from an isotropic liquid phase to a nematic phase, a sharp peak indicating transition from a nematic phase to a highly ordered smectic phase was observed at approximately 200° C. After transition to a smectic phase, no peak indicating crystallization was found, even with cooling to −50° C. Thus, the substance was found to retain a highly ordered smectic phase at approximately room temperature.

Figure 2:
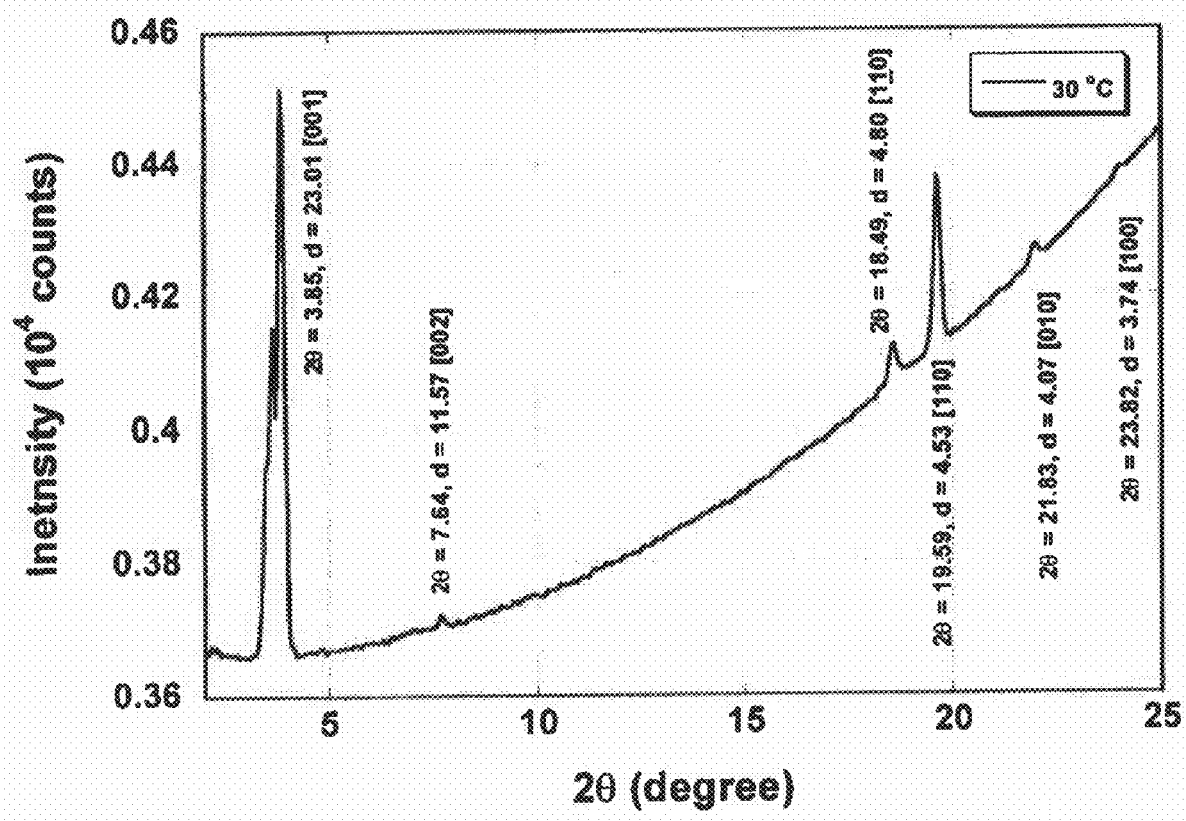
FIG. 2 shows an X-ray diffraction pattern of the smectic liquid crystal obtained in Example 1.

The liquid crystal compound obtained in Example 1 was subjected to X-ray diffraction measurement (FIG. 2). In the case of a highly ordered liquid crystal phase, in addition to a low-angle sharp peak (reflecting the layer structure), high-angle peaks indicating the long-range order in the layer were observed. Thus, since three high-angle diffraction peaks were observed, it is thought that the above phase is a smectic H or I phase in which a rectangular long-range order is retained.

Example 3

Charge Transport Characteristics

Charge transport characteristics (carrier transfer characteristics) of the liquid crystal compound 3 obtained in Example 1 were determined by the time-of-flight method. According to this method, a direct current is applied to a sandwich-type sample exhibiting photoconductivity and pulse laser irradiation is performed so as to generate photo carriers on one side of the sample. Time-course changes are determined in terms of the displacement current (transient photocurrent) that is induced in an external circuit when the carriers travels through the sample. Traveling of photo carriers causes the generation of a certain current. When carriers arrive at a counter electrode, the current is attenuated to 0. The time until the initiation of the attenuation of a transient photocurrent corresponds to the time necessary for the carriers to travel through the sample (transit time). Given that the sample thickness is "d" (cm), the applied voltage is "V" (volt), and the transit time is "$t_T$," the mobility "μ" (cm$^2$/Vs) is represented by the following formula.

$$\mu = \frac{d^2}{Vt_T}$$

When the irradiated-side electrode is positively biased, positive carrier mobility can be obtained. Likewise, when it is negatively biased, negative carrier mobility can be obtained.

Figure 3:
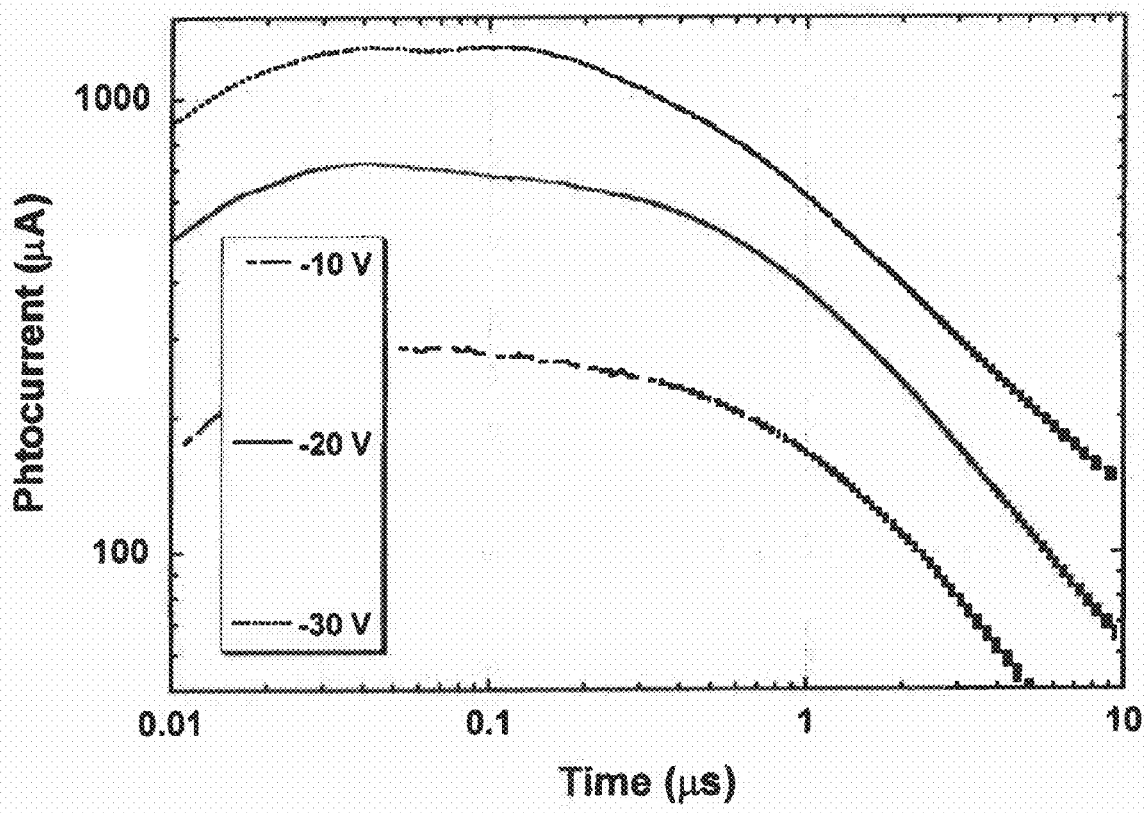
FIG. 3 shows a graph created based on measurement results of the charge mobility of the smectic liquid crystal obtained in Example 1 (in the case of a sample structure having a pair of electrode substrates) measured by the TOF method.

The liquid crystal cell prepared in Example 1 was kept at a constant temperature on a hot stage, during which the sample was subjected to pulse laser irradiation (Nd:YAG laser; THG: wave length 356 nm; pulse width: 1 ns) with voltage application. The displacement current induced at such time was measured with a digital oscilloscope. FIG. 3 shows results for measurement of a typical transient photocurrent in a highly ordered smectic phase in a case in which the irradiated-side electrode is negatively biased. The sample showed excellent photoconductivity so that sufficiently strong current signals were obtained. When the voltage was changed, the time until the initiation of current attenuation (transit time) varied in a corresponding manner, indicating that the obtained transient photocurrent concerns the traveling of carriers. At room temperature, the positive carrier mobility was 0.05 cm$^2$/Vs and the negative carrier mobility was 0.2 cm$^2$/Vs. These values are three orders of magnitude higher than those of a charge transport material generally used for an electroluminescence element and comparable to those of a polycrystalline thin film comprising an aromatic compound used for a thin film transistor. In particular, the electron mobility is significantly high, representing the highest value for the electron mobility of a liquid crystal semiconductor. Further, examples of a material showing electron-transporting properties (n-type conduction) are extremely limited, even though a polycrystalline thin film comprising an aromatic compound is included therein.

Example 4

A Method for Preparing a Thin Film Comprising a Smectic Liquid Crystal Compound

The smectic liquid crystal compound synthesized in Example 1 was dissolved in chlorobenzene and subjected to spin coating on a glass substrate such that a thin film in a smectic state was prepared. A 10 wt % toluene solution was subjected to rotation for 30 seconds at a rotational speed of 100 rpm for film formation, followed by drying for 3 hours in a vacuum oven. Thus, a thin film 50 nm in thickness was obtained.

Example 5

As in Example 1, the compounds listed in table 1 were synthesized. Table 1 lists phase sequences and phase transition temperatures of the obtained liquid crystal compounds.

TABLE 1

|  | Phase transition temperature, phase sequence (cooling process) |
|---|---|
| $R_1 = C_6H_7, R_2 = C_5H_{11}$, n = 0 | Iso 111° C. N 110° C. SmA 102° C. SmG |
| $R_1 = C_3H_7, R_2 = C_3H_7$, n = 1 | Iso 223° C.(ΔH = 0.49 J/g) N 200° C. (ΔH = 12.8 J/g) SmH |
| $R_1 = C_3H_7, R_2 = C_4H_9$, n = 1 | Iso 216° C.(ΔH = 0.37 J/g) N 203° C. (ΔH = 12.3 J/g) SmG |
| $R_1 = C_3H_7, R_2 = C_5H_{11}$, n = 1 | Iso 216° C.(ΔH = 0.57 J/g) N 201° C. (ΔH = 11.0 J/g) SmH |
| $R_1 = C_3H_7, R_2 = C_8H_{17}$, n = 1 | Iso 203° C.(ΔH = 0.5 J/g) N 199° C. (ΔH = 3 J/g) SmA 197° C. (ΔH = 7 J/g) SmG |
| $R_1 = C_6H_{13}, R_2 = C_5H_{11}$, n = 1 | Iso 201° C.(ΔH = 12.7 J/g) SmG |

* Iso: isotropic liquid; N: nematic phase; SmA: smectic A phase; SmG: smectic G phase; SmH: smectic H phase

[Preparation of a Thin Film Transistor]

Figure 4:
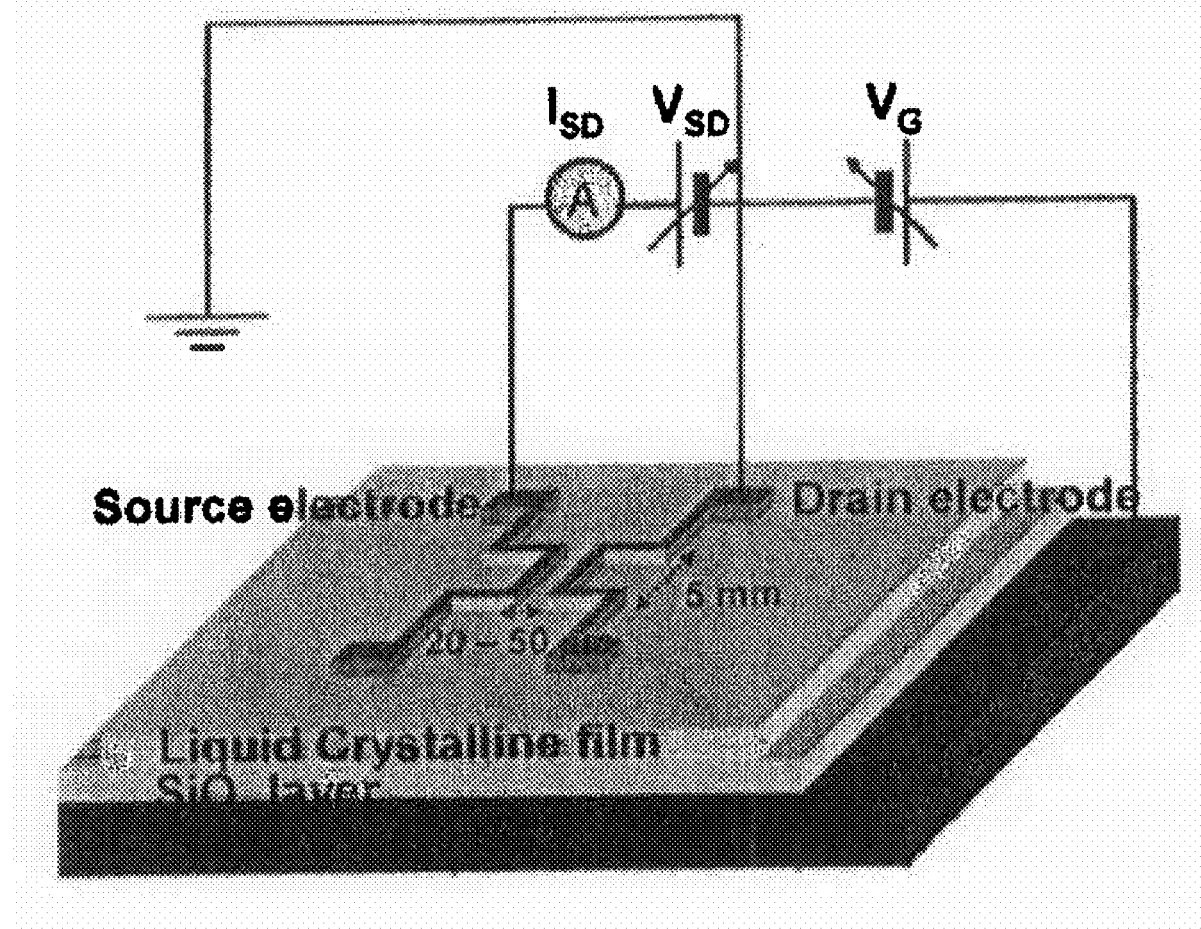
FIG. 4 is an explanatory view of the transistor of the present invention.

As shown in FIG. 4, a representative thin film transistor provided according to the present invention is obtained by laminating a liquid crystal semiconductor layer on a thermally oxidized film of a silicon substrate having a thermally oxidized film thereon and depositing a source electrode and a drain electrode each consisting of gold on the liquid crystal semiconductor layer.

Example 6

Preparation of a Liquid Crystal Semiconductor Thin Film

Figure 5:
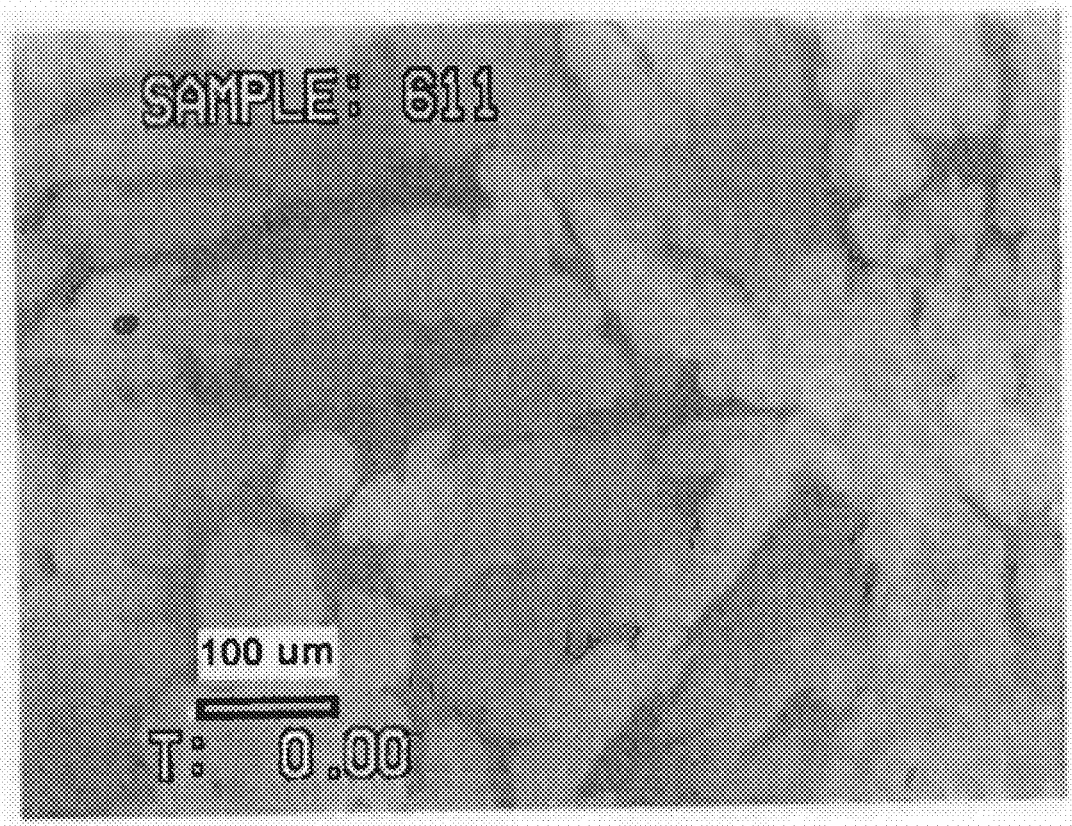
FIG. 5 shows a polarizing microscopic image of the thin film prepared in Example 6.
Figure 6:
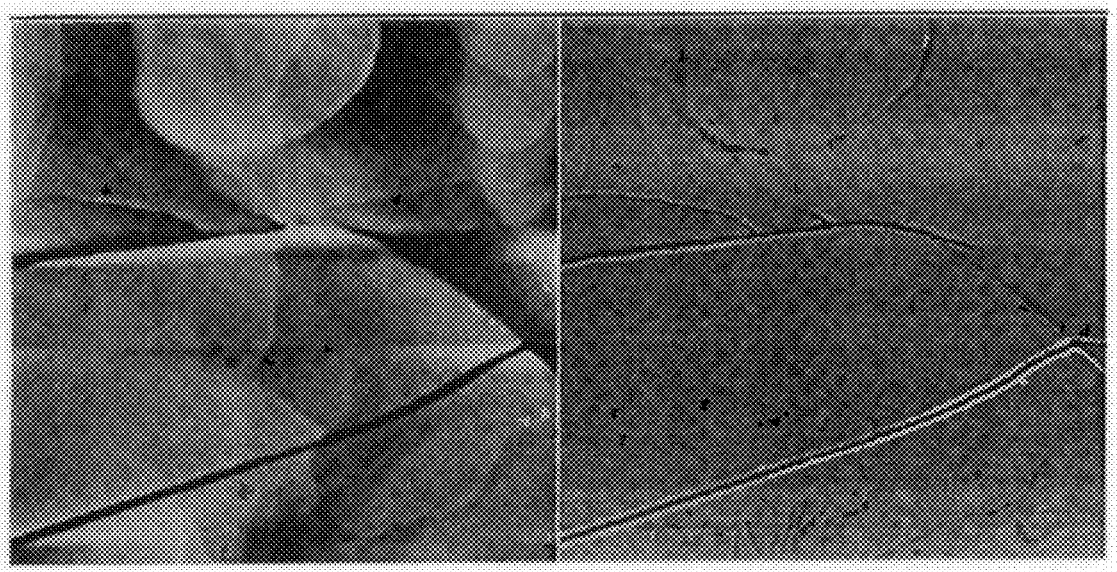
FIG. 6 shows AFM images of the thin films prepared in Examples 6 and 7 ((a): before annealing; (b): after annealing).
Figure 6:
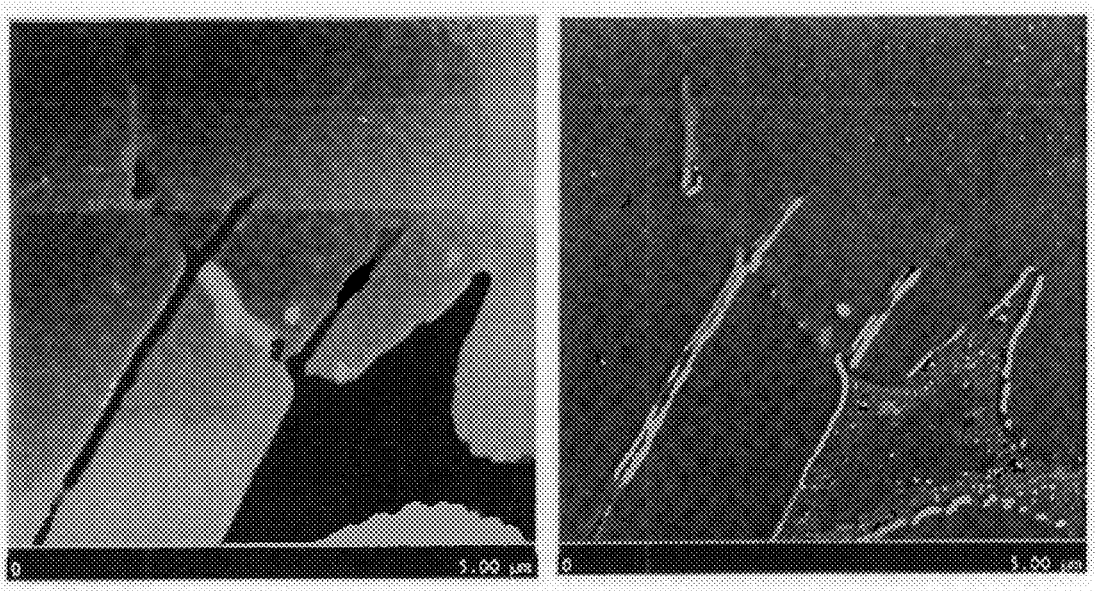

A smectic liquid crystal compound ($R_1$=$C_3H_7$; $R_2$=$C_5H_{11}$; n=1 in general formula (I)) was dissolved in chlorobenzene such that a solution having a concentration of 0.6 wt % was prepared. The solution was used for spin coating (rotational speed: 1500 rpm; time of revolution: 25 seconds) on a silicon substrate having a thermally oxidized film thereon ($SiO_2$; thickness: 300 nm). In addition, the oxidized film surface was treated with hexamethyldisilazane in advance. Then, drying at room temperature was carried out for 5 hours. FIG. 5 shows a polarizing microscopic image of the obtained thin film. The film comprises domains each having a several-hundred-micrometer size. It is understood that such domain is sufficiently larger than the channel width of a transistor prepared in the present invention. FIG. 6(a) shows AFM images of the obtained thin film. It is understood that the domain surface has several-tens-of-nanometer concave-convex portions.

Example 7

Annealing of a Liquid Crystal Semiconductor Thin Film and Evaluation of the Structure The obtained thin film was subjected to heat-annealing in a vacuum oven at 120° C. for 10 minutes, followed by cooling to room temperature. FIG. 6(b) shows AFM images after annealing. It is understood that the domain surface has molecular-level flatness. In the case of a usual molecular crystalline deposited film, enlargement of the crystal grain size due to heat annealing is observed; however, the surface morphology had no molecular-level flatness. This indicates that effects of molecular motion in a liquid crystal material significantly influence rearrangement of molecular orientation in domains.

Example 8

Preparation and Evaluation of a Thin Film Transistor

Figure 7:
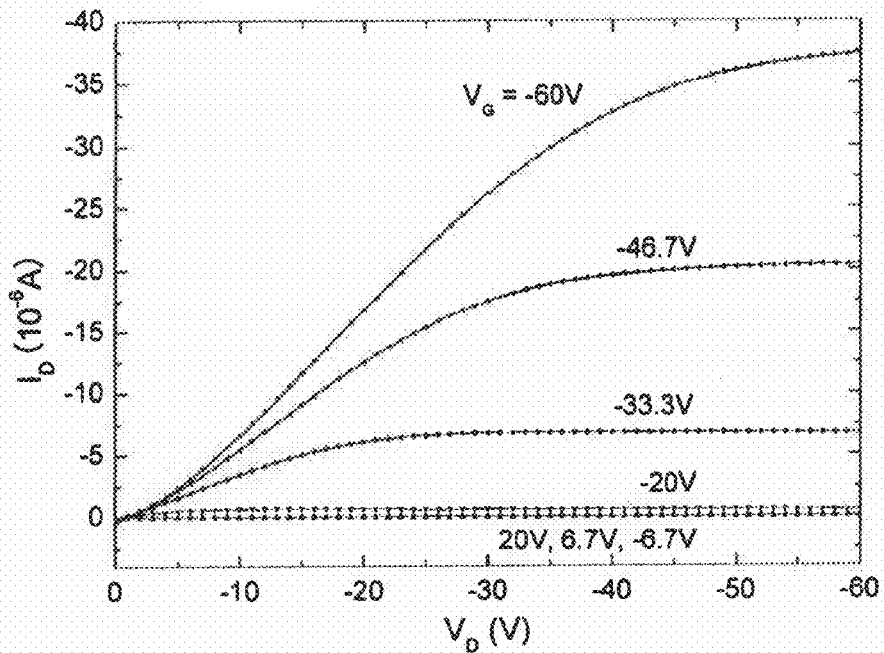
FIG. 7 shows a characteristic chart of the transistor (under normal atmosphere) prepared in Example 8 ((a): output characteristics; (b): transfer characteristics).
Figure 7:
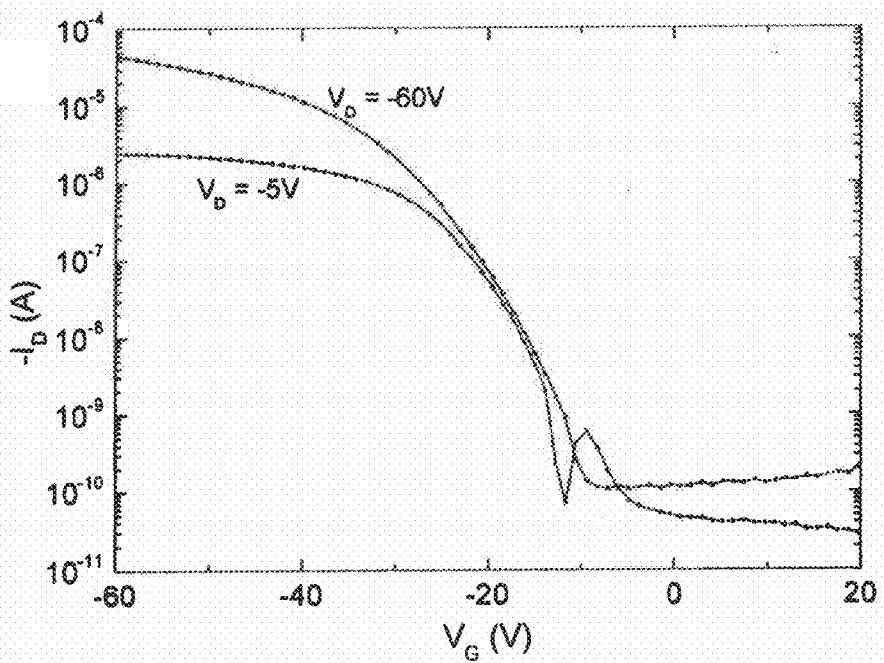

A gold electrode was deposited via a shadow mask on the thin film treated by thermal annealing. The deposition rate was "1 A/s" and the electrode thickness was 60 nm. FIG. 4 shows the mask pattern of the electrode and the structure of the device. The transistor characteristics were determined using a Kethley digital source meter. FIG. 7(a) shows the output characteristics in a case in which the transistor was driven under normal atmosphere. FIG. 7(b) shows the transfer characteristics. When a negative voltage was applied to a gate electrode, a source-drain current flowed, indicating that the transistor exhibits p-type characteristics.

$$I_{SD} = \frac{W}{2L} C_i \mu (V_G - V_T)^2 \quad (1)$$

The carrier mobility was obtained via formula (I), resulting in 0.05 cm$^2$/Vs. The on-off ratio reached 10$^6$. Although the obtained results are inferior to those of a thin film transistor using a molecular crystalline vacuum-deposited film, they were excellent for a transistor prepared by a solution process.

In addition, a transistor (n-type operation) was prepared in a similar manner.

INDUSTRIAL APPLICABILITY

The liquid crystal compound of the present invention exhibits excellent ambipolar charge transport characteristics.

In particular, the electron mobility exceeds 0.1 cm²/Vs. In addition, film formation via a low-cost solution process can be realized. A thin film prepared by a solution process can be applied to logic elements such as electroluminescence elements, thin film transistors, and inverter circuits using such elements or transistors.

Further, since the thin film transistor of the present invention can be prepared by a solution process, it is effective for low-cost production and large-area formation of a device. The thin film transistor of the present invention can be used as a driver element for a display element of a liquid crystal display or the like. In particular, the transistor comprises a liquid crystal material and thus it is superior in flexibility to a thin film transistor comprising a molecular crystal. Therefore, it can be used for a driver element of electronic paper, a flexible display, or the like.

The invention claimed is:

1. A smectic liquid crystal compound represented by the following general formula (1)

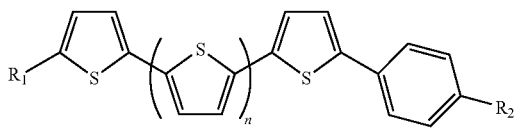

wherein $R_1$ represents a straight-chain alkyl group having 1 to 8 carbon atoms, $R_2$ represents an alkyl or alkoxy group having 1 to 8 carbon atoms, and "n" is an integer of 0 to 3.

2. An ambipolar charge-transporting material comprising the smectic liquid crystal compound according to claim 1.

3. An organic semiconductor thin film having a substrate and a thin film layer comprising the smectic liquid crystal compound according to claim 1.

4. The organic semiconductor thin film according to claim 3, wherein the substrate is a silicon substrate having a thermally oxidized film.

5. A method for producing the organic semiconductor thin film according to claim 3 or 4, comprising the steps of: applying a solution comprising the smectic liquid crystal compound according to claim 1 to a substrate; and annealing the applied liquid crystal compound.

6. A thin film transistor comprising the organic semiconductor thin film according to claim 3 or 4.

7. The thin film transistor according to claim 6, wherein the semiconductor thin film is a p-type semiconductor.

\* \* \* \* \*